United States Patent
Hwang et al.

(10) Patent No.: US 10,431,641 B2
(45) Date of Patent: Oct. 1, 2019

(54) THIN FILM TRANSISTOR SUBSTRATE, AN ORGANIC LIGHT-EMITTING DISPLAY APPARATUS USING THE SAME, AND A METHOD OF MANUFACTURING THE THIN FILM TRANSISTOR SUBSTRATE

(71) Applicant: SAMSUNG DISPLAY CO., LTD., Yongin-si, Gyeonggi-Do (KR)

(72) Inventors: Hyunbeen Hwang, Yongin-si (KR); Minchul Shin, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 15/461,772

(22) Filed: Mar. 17, 2017

(65) Prior Publication Data

US 2017/0271424 A1    Sep. 21, 2017

(30) Foreign Application Priority Data

Mar. 17, 2016  (KR) .................. 10-2016-0032072

(51) Int. Cl.
| | | |
|---|---|---|
| *H01L 29/08* | (2006.01) | |
| *H01L 27/32* | (2006.01) | |
| *H01L 27/12* | (2006.01) | |

(52) U.S. Cl.
CPC ........ *H01L 27/3262* (2013.01); *H01L 27/124* (2013.01); *H01L 27/1248* (2013.01); *H01L 27/1255* (2013.01); *H01L 27/1288* (2013.01); *H01L 27/3258* (2013.01); *H01L 27/3276* (2013.01); *H01L 2227/323* (2013.01)

(58) Field of Classification Search
CPC .................................................. H01L 51/5259
USPC ........................................................ 257/40
See application file for complete search history.

(56) References Cited

U.S. PATENT DOCUMENTS

| | | | | |
|---|---|---|---|---|
| 4,081,397 A | * | 3/1978 | Booe ................. | C08K 3/22 |
| | | | | 252/194 |
| 5,607,227 A | | 3/1997 | Yasumoto et al. | |
| 8,716,702 B2 | | 5/2014 | Kim | |

(Continued)

FOREIGN PATENT DOCUMENTS

| | | |
|---|---|---|
| KR | 1019930018712 | 9/1993 |
| KR | 1019950006491 | 3/1995 |

(Continued)

*Primary Examiner* — Caleb E Henry
(74) *Attorney, Agent, or Firm* — F. Chau & Associates, LLC (57) ABSTRACT

A thin film transistor (TFT) substrate includes a substrate and a first electrode disposed on the substrate. The first electrode is one of a source electrode and a drain electrode. The TFT further includes a first insulating layer disposed on the first electrode and a second electrode disposed on the first insulating layer. The second electrode is the other one of the source electrode and the drain electrode. The TFT additionally includes a semiconductor layer disposed on the first electrode, the first insulating layer, and the second electrode. The TFT further includes a second insulating layer disposed on the semiconductor layer. The TFT additionally includes a gate electrode disposed on the second insulating layer and overlapping the semiconductor layer. The TFT further includes a pixel electrode that includes a same material as the gate electrode and is electrically connected to the second electrode.

20 Claims, 6 Drawing Sheets

(56) References Cited

U.S. PATENT DOCUMENTS

| | | |
|---|---|---|
| 2006/0267492 A1 | 11/2006 | Oh |
| 2010/0163859 A1* | 7/2010 | Yamazaki .......... H01L 21/6835 257/40 |
| 2012/0074408 A1* | 3/2012 | Moon ................. H01L 27/3262 257/57 |
| 2016/0307985 A1 | 10/2016 | Beak et al. |

FOREIGN PATENT DOCUMENTS

| | | |
|---|---|---|
| KR | 1020070053029 | 5/2007 |
| KR | 1020120042143 | 5/2012 |
| KR | 1020150079094 | 7/2015 |

* cited by examiner

THIN FILM TRANSISTOR SUBSTRATE, AN ORGANIC LIGHT-EMITTING DISPLAY APPARATUS USING THE SAME, AND A METHOD OF MANUFACTURING THE THIN FILM TRANSISTOR SUBSTRATE

CROSS-REFERENCE TO RELATED APPLICATION

This application claims priority under 35 USC § 119 to Korean Patent Application No. 10-2016-0032072 filed on Mar. 17, 2016 in the Korean Intellectual Property Office, the disclosure of which is incorporated by reference herein in its entirety.

TECHNICAL FIELD

Exemplary embodiments of the present invention relate to a thin film transistor substrate, and more particularly, to a thin film transistor substrate, an organic light-emitting display apparatus using the same, and a method of manufacturing the thin film transistor substrate.

DISCUSSION OF THE RELATED ART

Due to rapid development of semiconductor technologies, the demand for display devices has been increasing, and improvements to display devices have been under development. For example, screen sizes of display devices have been increased while the weight of the display devices have been reduced.

An organic light-emitting display apparatus includes two electrodes and an organic light-emitting layer disposed between the two electrodes, and emits light when energy is discharged from excitons formed in the organic light-emitting layer by combining electrons injected from one of the electrodes and holes injected from the other electrode.

The organic light-emitting display apparatus includes a plurality of pixels including an emissive organic light-emitting diode, and each of the pixels includes a plurality of thin film transistors and at least one capacitor for driving the organic light-emitting diode.

Currently, techniques for increasing resolution and pixel integrity of a display apparatus having a relatively small size are under development. However, a high resolution display apparatus may, for example, produce a relatively low brightness and have a relatively high power consumption due to a relatively small opening ratio.

SUMMARY

According to an exemplary embodiment of the present invention, a thin film transistor (TFT) substrate includes a substrate and a first electrode disposed on the substrate. The first electrode is one of a source electrode and a drain electrode. The TFT further includes a first insulating layer disposed on the first electrode and a second electrode disposed on the first insulating layer. The second electrode is the other one of the source electrode and the drain electrode. The TFT additionally includes a semiconductor layer disposed on the first electrode, the first insulating layer, and the second electrode. The TFT further includes a second insulating layer disposed on the semiconductor layer. The TFT additionally includes a gate electrode disposed on the second insulating layer and overlapping the semiconductor layer. The TFT further includes a pixel electrode that includes a same material as the gate electrode and is electrically connected to the second electrode.

According to an exemplary embodiment of the present invention, a method of manufacturing a TFT substrate, the method includes sequentially forming a lower electrode, a first insulating layer, and an upper electrode on a substrate. The method further includes forming a semiconductor layer on the lower electrode, the first insulating layer, and the upper electrode. The method additionally includes forming a gate electrode that overlaps the semiconductor layer. The method further includes forming a pixel electrode that is electrically connected to the upper electrode. The forming of the gate electrode and the forming of the pixel electrode are performed in a same mask process.

According to an exemplary embodiment of the present invention, TFT substrate includes a substrate and a lower electrode disposed on the substrate. The lower electrode includes a first part and a second part. The TFT further includes a first insulating layer disposed on the substrate, partially covering the first part of the lower electrode, and including an opening exposing the second part of the lower electrode. The TFT additionally includes an upper electrode disposed on the first insulating layer. The upper electrode overlaps a portion of the first part of the lower electrode. The TFT further includes a semiconductor layer disposed on the second part of the lower electrode, the first insulating layer, and the upper electrode. The semiconductor layer extends vertically along a side surface of the first insulating layer and a length of the semiconductor layer corresponds to a thickness of the first insulating layer. The TFT additionally includes a second insulating layer disposed on the semiconductor layer, and a gate electrode disposed on the second insulating layer.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Exemplary embodiments of the present invention will be described in more detail below with reference to the accompanying drawings. It is to be understood that the present invention may have different forms, and thus, should not be construed as being limited to the embodiments set forth herein In the drawings, like reference numerals may be used for elements that are substantially identical or correspond to each other, and the descriptions thereof might not be repeated.

As used herein, the singular forms "a," "an" and "the" are intended to include the plural forms as well, unless the context clearly indicates otherwise.

It will be understood that when an element or layer is referred to as being "on" another element or layer, the element or layer may be directly on another element or layer or intervening elements or layers. It will also be understood that when an element or layer is referred to as being "connected to" another element or layer, the element or layer may be directly connected to the other element or layer or intervening elements or layers therebetween.

Sizes of elements in the drawings may be exaggerated for convenience of explanation.

When an exemplary embodiment of the present invention may be implemented differently, a process order may be performed differently from the described order. For example, two consecutively described processes may be performed at substantially the same time or performed in an order opposite to the described order.

Figure 1:
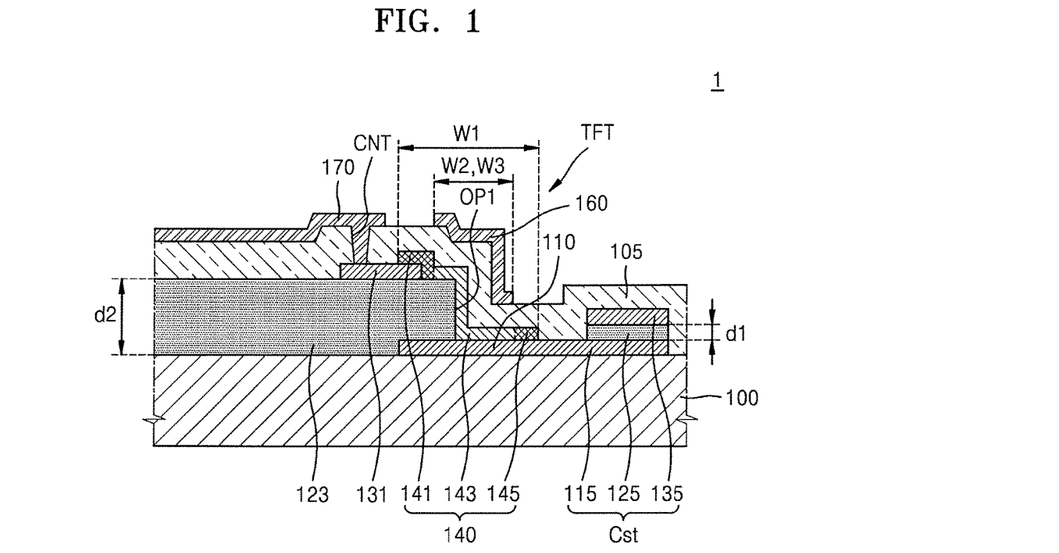
FIG. 1 is a cross-sectional view of a thin film transistor (TFT) substrate according to an exemplary embodiment of the present invention.

FIG. 1 is a cross-sectional view of a thin film transistor (TFT) substrate 1 according to an exemplary embodiment of the present invention.

Referring to FIG. 1, the TFT substrate 1 includes a substrate 100, a lower electrode 110, a first insulating layer 123, an upper electrode 131, a semiconductor layer 140, a gate electrode 160, and a pixel electrode 170.

The substrate 100 may be made of a glass material, a metal material, or a plastic material, such as polyethylene terephthalate (PET), polyethylene naphthalate (PEN), or polyimide. A buffer layer may be provided on the substrate 100 to planarize the substrate 100 and to prevent fluorine elements and other impurities or foreign elements from penetrating from the substrate 100. The buffer layer may be a single layer or multiple layers of silicon nitride and/or silicon oxide.

The lower electrode 110 may be provided on the substrate 100. The lower electrode 110 may be a source electrode or a drain electrode. Hereinafter, for convenience of explanation, a case when the lower electrode 110 is a source electrode will be described. The lower electrode 110 may at least partially overlap the upper electrode 131. However, the lower electrode 110 may include a non-overlapping region with the upper electrode 131 to provide a contact area with the semiconductor layer 140. For example, the lower electrode 110 may be a single layer or multiple layers including at least one metal of Al, Pt, Pd, Ag, Mg, Au, Ni, Nd, Ir, Cr, Li, Ca, Mo, Ti, W, or Cu.

The first insulating layer 123 may be disposed on the lower electrode 110. The first insulating layer 123 may partially overlap the lower electrode 110. The first insulating layer 123 may be formed to ensure insulation between the lower electrode 110 and the upper electrode 131, and may have a second thickness d2. For example, the first insulating layer 123 may be a buffer layer or an interlayer insulating film. The first insulating layer 123 may be, for example, an organic insulating film. The organic insulating film may include an acrylic group polymer, such as polymethyl methacrylate (PMMA), polystyrene (PS), a polymer derivative having a phenol group, an imide group polymer, an aryl ether group polymer, an amide group polymer, a fluorine group polymer, a p-zylene group polymer, a vinyl alcohol group polymer, and a mixture of these materials. However, an exemplary embodiment of the present invention is not limited thereto. For example, the first insulating layer 123 may include an inorganic insulating film, such as silicon oxide or silicon nitride.

The first insulating layer 123 may include a first opening OP1 that exposes an upper surface of the lower electrode 110. The first opening OP1 of the first insulating layer 123 may expose a non-overlapping region of the lower electrode 110. The lower electrode 110 may contact the semiconductor layer 140 through the first opening OP1 of the first insulating layer 123.

The upper electrode 131 may be disposed on the first insulating layer 123. The upper electrode 131 may be the source electrode or the drain electrode. As described above, as an example, when the lower electrode 110 is a source electrode, the upper electrode 131 may be a drain electrode.

The upper electrode 131 and the lower electrode 110 may include the same material, but an exemplary embodiment of the present invention is not limited thereto. In an exemplary embodiment of the present invention, the upper electrode 131 and the lower electrode 110 may include different materials from each other. The upper electrode 131 may be a single layer or multiple layers including at least one metal of Al, Pt, Pd, Ag, Mg, Au, Ni, Nd, Ir, Cr, Li, Ca, Mo, Ti, W, or Cu.

The semiconductor layer 140 may be disposed on the lower electrode 110, the first insulating layer 123, and the upper electrode 131. The semiconductor layer 140 may be formed on the lower electrode 110 and the upper electrode 131 that may be different layers from each other. Accordingly, a vertical channel may be formed instead of a plane channel by contacting the source electrode and the drain electrode. For example, the vertical channel may extend along a side surface of the first insulating layer to connect the lower electrode 110 and the upper electrode 131. The semiconductor layer 140 may overlap an upper surface of the lower electrode 110 and an upper surface of the upper electrode 131.

Since the semiconductor layer 140 may be disposed to contact the lower electrode 110, the first insulating layer 123, and the upper electrode 131, a channel length of the TFT may be determined by the overlapping length of the upper electrode 131 and the semiconductor layer 140, the overlapping length of the lower electrode 110 and the semiconductor layer 140 and/or a second thickness d2 of the first insulating layer 123. For example, when the thickness of the second thickness d2 is reduced, the length of the channel length may be reduced. The semiconductor layer 140 may contact the lower electrode 110 through a non-overlapping region of the lower electrode 110. For example, the semiconductor layer 140 may contact the non-overlapping region of the lower electrode 110 exposed through the first opening OP1 of the first insulating layer 123.

The semiconductor layer 140 includes a channel region 143 and source and drain regions 145 and 141 respectively formed on both sides of the channel region 143. The semiconductor layer 140 includes a semiconductor material, for example, amorphous silicon or poly crystalline silicon. Poly crystalline silicon may be formed by crystallizing amorphous silicon. Amorphous silicon may be crystallized by various methods, for example, a rapid thermal annealing (RTA) method, a solid phase crystallization (SPC) method, an excimer laser annealing (ELA) method, a metal-induced crystallization (MIC) method, a metal-induced lateral crystallization (MILC) method, or a sequential lateral solidification (SLS) method. However, an exemplary embodiment of the present invention is not limited thereto. For example, the semiconductor layer 140 according to an exemplary embodiment of the present invention may include an organic semiconductor material or an oxide semiconductor material.

The gate electrode 160 may be disposed over the semiconductor layer 140 to overlap with the semiconductor layer 140. Since the gate electrode 160 overlaps the semiconductor layer 140, the gate electrode 160 may have a vertical structure that corresponds to the semiconductor layer 140 having a vertical channel structure. The gate electrode 160 has a second width W2 on a plan view that may be smaller than a first width W1 of the semiconductor layer 140. As an example, the second width W2 of the gate electrode 160 may be substantially equal to a third width W3 of the channel region 143 of the semiconductor layer 140. However, an exemplary embodiment of the present invention is not limited thereto. For example, when lightly doped drain (LDD) regions are formed on both sides of the channel region 143, the second width of the gate electrode 160 may be less than the third width of the channel region 143.

To provide insulation between the gate electrode 160 and the semiconductor layer 140, a second insulating layer 105 may be disposed between the gate electrode 160 and the semiconductor layer 140. The second insulating layer 105 may be a gate insulating film or a via insulating film. The second insulating layer 105 may be a single layer or multiple layers of silicon oxide or silicon nitride.

The pixel electrode 170 may be disposed on the second insulating layer 105. The pixel electrode 170 may be level with the gate electrode 160. The pixel electrode 170 may be connected to the upper electrode 131, which is a drain electrode, through a contact hole CNT penetrating the second insulating layer 105. In addition, the pixel electrode 170 may be formed using the same material used to form the gate electrode 160.

The pixel electrode 170 may include a (semi) transparent electrode or a reflective electrode. When the pixel electrode 170 includes a (semi) transparent electrode, the pixel electrode 170 may include, for example, at least one material selected from the group consisting of indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 170 includes a reflective electrode, the pixel electrode 170 may include at least one metal selected from the group consisting of Al, Pt, Pd, Ag, Mg, Au, Ni, Nd, Ir, Cr, Li, Ca, Mo, Ti, W, or Cu. However, an exemplary embodiment of the present invention is not limited thereto. For example, the pixel electrode 170 may include various materials. In addition, the pixel electrode 170 may be modified into various structures, such as a single layer or multiple layers.

The TFT substrate 1 according to an exemplary embodiment of the present invention may further include a storage capacitor Cst.

The storage capacitor Cst may include a first electrode 115, a dielectric layer 125, and a second electrode 135 that are sequentially stacked in this order. In addition, the first electrode 115 may be formed by the same process for forming the lower electrode 110 using the same material. For example, as depicted in FIG. 1, a part of the lower electrode 110 may be the first electrode 115. However, an exemplary embodiment of the present invention is not limited thereto. For example, the lower electrode 110 and the first electrode 115 may be arranged separately from each other.

The dielectric layer 125 may be formed by the same process for forming the first insulating layer 123 while using the same material as the first insulating layer 123. For example, the dielectric layer 125 may include a part of the first insulating layer 123 that is formed between the upper electrode 131 and the lower electrode 110. In FIG. 1, the first insulating layer 123 is separated from the dielectric layer 125 for convenience of explanation. However, the first insulating layer 123 may be connected to the dielectric layer 125 except for the region where the first opening OP1 is located. In this case, to provide a capacitor capacity of the storage capacitor Cst, the first thickness d1 of the dielectric layer 125 may be less than the second thickness d2 of the first insulating layer 123.

The second electrode 135 may be formed of the same material used to form the upper electrode 131. In FIG. 1, due to a thickness difference between the first insulating layer 123 and the dielectric layer 125, it may seem that the second electrode 135 and the upper electrode 131 are disposed on different layers. However, the second electrode 135 may be formed together with the upper electrode 131 using the same mask process.

In the TFT substrate 1 according to an exemplary embodiment of the present invention, an area occupied by a TFT may be reduced through the vertical channel structure, and thus, an opening ratio of the TFT substrate 1 may be increased.

In the specification, the TFT substrate may denote that a TFT is formed on a substrate, and may denote a state that a TFT is formed on the substrate 100 or a state that all elements up to pixel electrode 170 are formed on the TFT, as depicted in FIG. 1.

Figure 2:
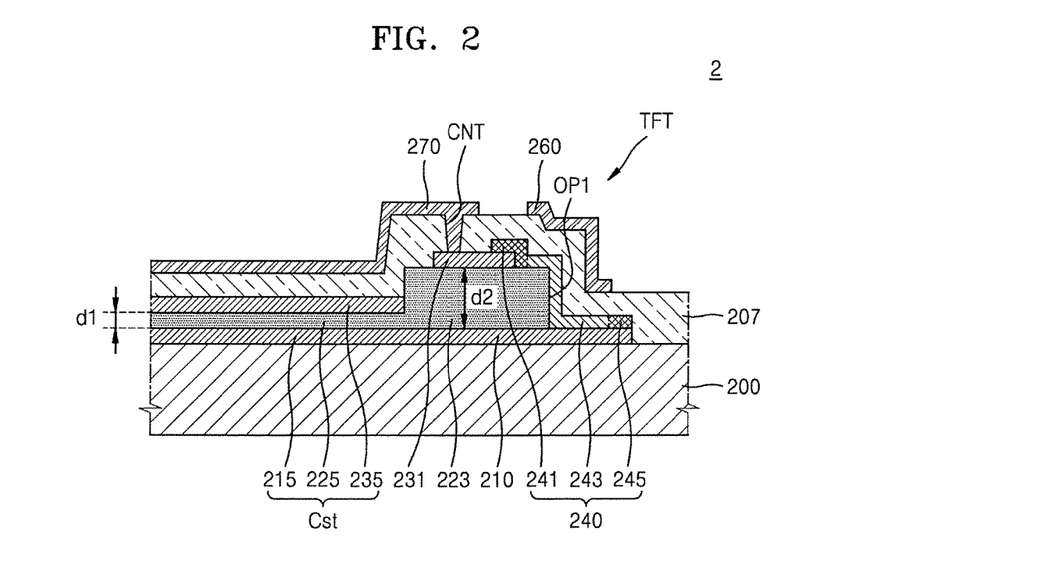
FIG. 2 is a cross-sectional view of a TFT substrate according to an exemplary embodiment of the present invention.

FIG. 2 is a cross-sectional view of a TFT substrate 2 according to an exemplary embodiment of the present invention.

Referring to FIG. 2, the TFT substrate 2 includes a substrate 200, a lower electrode 210, a first insulating layer 223, an upper electrode 231, a semiconductor layer 240, a gate electrode 260, a pixel electrode 270, a first electrode 215, a dielectric layer 225, and a second electrode 235 of a storage capacitor Cst. The TFT substrate 2 according to an exemplary embodiment of the present invention has substantially the same constituent elements as the constituent elements of the TFT substrate 1 according to an exemplary embodiment of the present invention except for, for example, the location of the storage capacitor Cst, and thus, the descriptions thereof might not be repeated.

The storage capacitor Cst according to the current exemplary embodiment present invention may overlap the pixel electrode 270.

The storage capacitor Cst may include the first electrode 215, the dielectric layer 225, and the second electrode 235 that are sequentially stacked in this stated order. In this case, the first electrode 215 and the lower electrode 210 may include the same material. As an example, as depicted in FIG. 2, a part of the lower electrode 210 may be the first electrode 215 of the storage capacitor Cst. For example, the lower electrode 210 may extend below the pixel electrode 270 to make the first electrode 215. In addition, in an exemplary embodiment of the present invention, the non-overlapping region of the lower electrode 210 may be completely covered by the semiconductor layer 240.

The dielectric layer 225 may include a part of the first insulating layer 223 disposed between the upper electrode 231 and the lower electrode 210. In this case, to provide a capacitor capacity of the storage capacitor Cst, a first thickness d1 of the dielectric layer 225 may be less than a second thickness d2 of the first insulating layer 223.

The second electrode 235 may include the same material used to form the upper electrode 231. In FIG. 2, due to a thickness difference between the first insulating layer 223 and the dielectric layer 225, it may seem that the second electrode 235 and upper electrode 231 are disposed on different layers. However, the second electrode 235 may be formed together with the upper electrode 231 using the same mask process. The second electrode 235 may be disposed below the pixel electrode 270.

As described above, the TFT substrate 2 according to the current exemplary embodiment of the present invention may be used in a top emission-type light-emitting display apparatus, and the capacity of a capacitor may be increased by arranging the storage capacitor Cst below the pixel electrode 270.

Hereinafter, a method of manufacturing the TFT substrate 1 according to an exemplary embodiment of the present invention will be described with reference to FIGS. 3 through 8.

FIGS. 3 through 8 are cross-sectional views illustrating a method of manufacturing a TFT substrate 1 according to an exemplary embodiment of the present invention.

Figure 3:
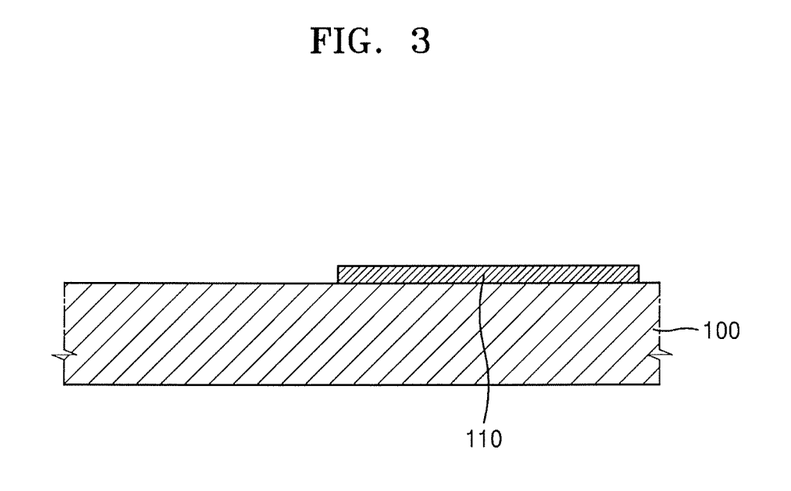
FIGS. 3 through 8 are cross-sectional views illustrating a method of manufacturing a TFT substrate according to an exemplary embodiment of the present invention.

Referring to FIG. 3, the lower electrode 110 is formed on the substrate 100. The substrate 100 may include various materials, for example, a glass material, a metal material, or a plastic material, such as PET, PEN, or polyimide. Although in FIG. 3, the lower electrode 110 may be formed directly on the substrate 100, the current embodiment is not limited thereto. For example, after forming a barrier layer, such as a buffer layer as a single layer or multiple layers on the substrate 100, the lower electrode 110 may be formed thereon. The lower electrode 110 may include a non-overlapping region that does not overlap the upper electrode 131.

The lower electrode 110 may include a single layer or multiple layers including at least one metal selected from the group consisting of Al, Pt, Pd, Ag, Mg, Au, Ni, Nd, Ir, Cr, Li, Ca, Mo, Ti, W, or Cu, while taking into account adhesiveness with neighboring layers, surface flatness of a stacked layer, and processability.

The first electrode 115 of the storage capacitor Cst may be formed by the same process for forming the lower electrode 110. As an example, a part of the lower electrode 110 may be the first electrode 115.

Figure 4:
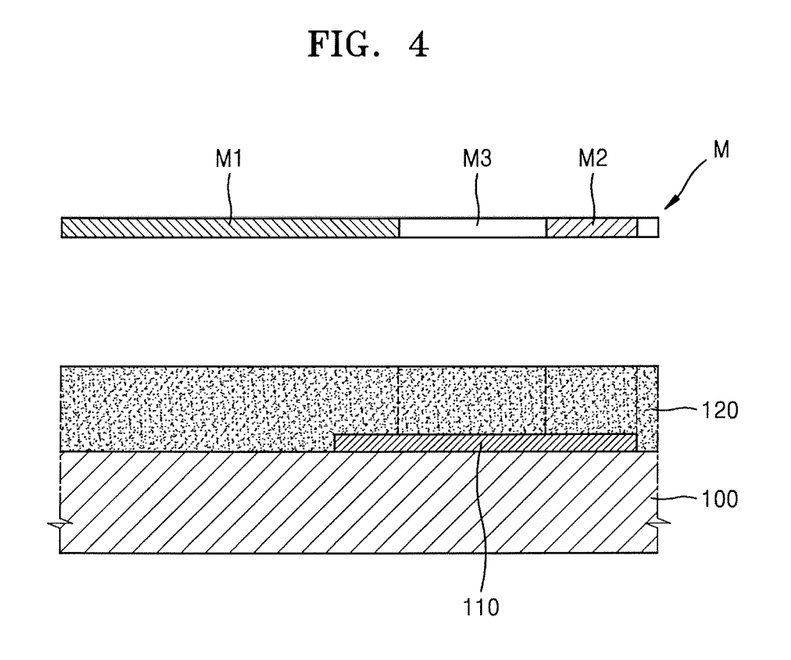
Figure 5:
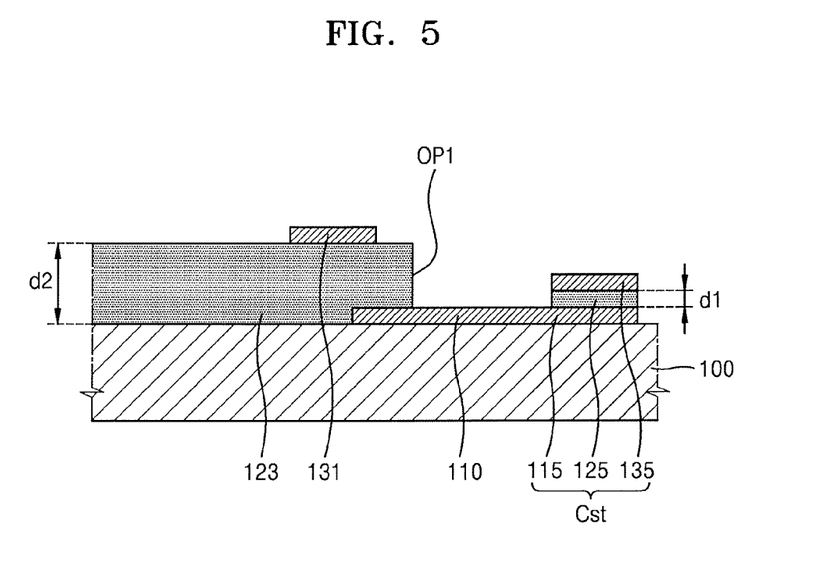

Referring to FIGS. 4 and 5, after coating a first insulating material 120 on the lower electrode 110 to cover the lower electrode 110, the first insulating layer 123 and the dielectric layer 125 are formed by patterning the first insulating material 120.

The first insulating material 120 may include a photosensitive organic material, such as polyimide. Light may be irradiated onto the first insulating material 120 by using a photomask M. The photomask M may be formed by using either a halftone mask or a slit mask. As an example, if the photomask M is a halftone mask, the photomask M may include a transparent unit M3, a light blocking unit M1, and a semi-transparent unit M2. The transparent unit M3 may correspond to the first opening OP1 which is a region where the first insulating material 120 will be completely removed. The light blocking unit M1 may correspond to the first insulating layer 123. The semi-transparent unit M2 may correspond to the dielectric layer 125. As another example, if the photomask M is a slit mask, the slit mask may include a slit unit M2 including at least one slit bar that blocks light, a transparent unit M3 that transmits light, and a light blocking unit M1 that blocks light.

After completely removing the first insulating material 120 onto which light is irradiated through the transparent unit M3 and removing a portion of the first insulating material 120 onto which light is irradiated through the semi-transparent unit M2, the first insulating layer 123, the dielectric layer 125 and the first opening OP1 may be formed. Here, the second thickness d2 of the first insulating layer 123 may be greater than the thickness d1 of the dielectric layer 125 (d2>d1). The first opening OP1 may be located on the non-overlapping region of the lower electrode 110 to expose an upper surface of the lower electrode 110.

The upper electrode 131 may be formed on the first insulating layer 123. The second electrode 135 of the storage capacitor Cst may be formed on the dielectric layer 125.

Figure 6:
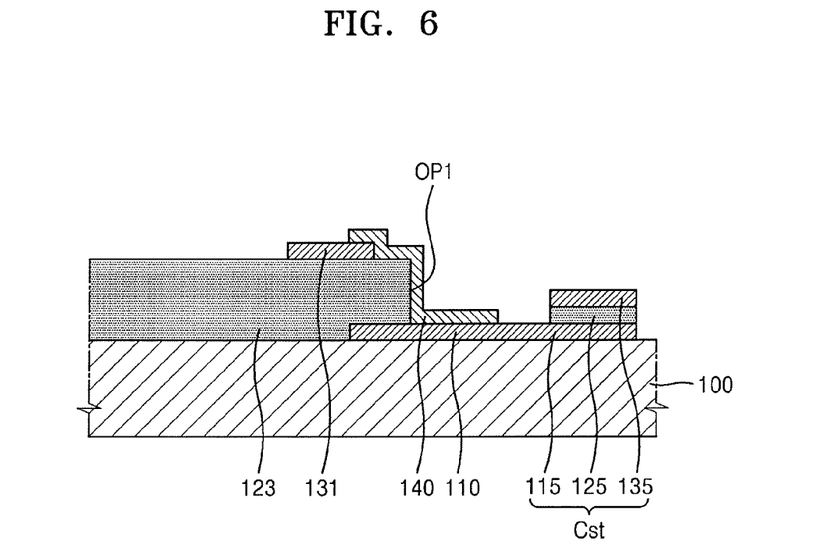

Referring to FIG. 6, the semiconductor layer 140 that contacts the lower electrode 110, the first insulating layer 123, and the upper electrode 131 may be formed. The semiconductor layer 140 may contact the non-overlapping region of the lower electrode 110 through the first opening OP1. The semiconductor layer 140 may form a vertical channel by contacting the lower electrode 110 and the upper electrode 131 that are disposed on different layers from each other. In other words, the vertical channel may be formed by contacting source and drain electrodes. Since the semiconductor layer 140 contacts the lower electrode 110, the first insulating layer 123, and the upper electrode 131, a channel length of the TFT may be determined by the overlapping length of the upper electrode 131 and the semiconductor layer 140, the overlapping length of the lower electrode 110 and the semiconductor layer 140 and/or the second thickness d2 of the first insulating layer 123.

Figure 7:
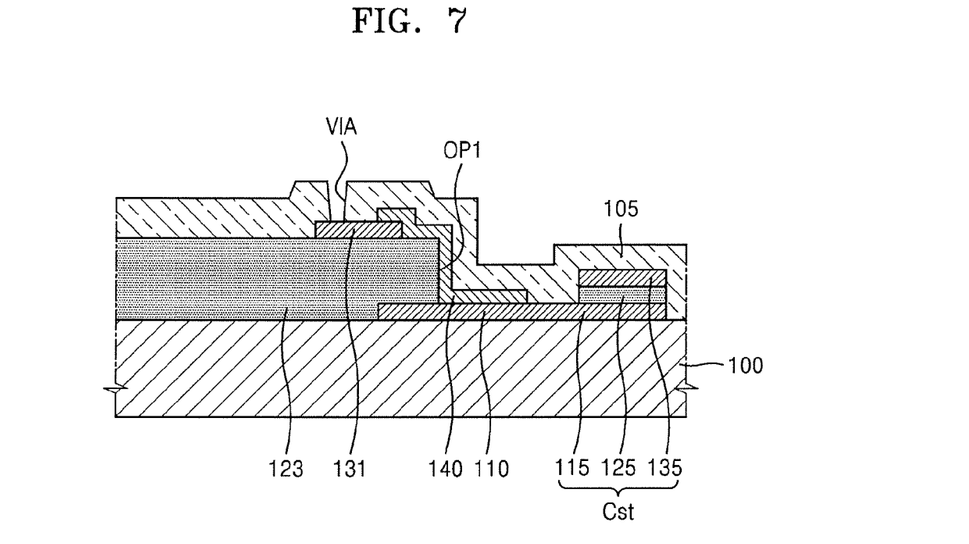

Referring to FIG. 7, the second insulating layer 105 is formed on the semiconductor layer 140 to cover the TFT. The second insulating layer 105 may be a gate insulating film or a via insulating film. The second insulating layer 105 may include a single layer or multiple layers made of, for example, silicon oxide or silicon nitride. The second insulating layer 105 may include the contact hole CNT.

Figure 8:
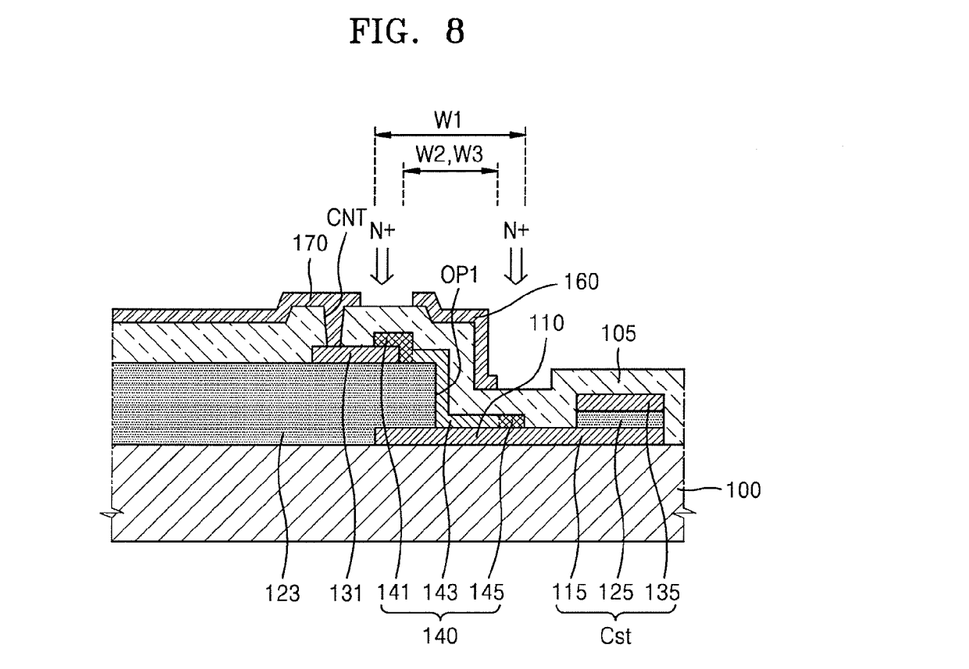

Referring to FIG. 8, the gate electrode 160 and the pixel electrode 170 are formed on the second insulating layer 105. The gate electrode 160 may overlap the semiconductor layer 140. A second width W2 of the gate electrode 160 may be less than a first width W1 of the semiconductor layer 140. The pixel electrode 170 electrically connected to the upper electrode 131 is formed in the same mask process as that for forming the gate electrode 160. The pixel electrode 170 may be electrically connected to the upper electrode 131 through the contact hole CNT formed in the second insulating layer 105.

The pixel electrode 170 may include the same material as the gate electrode 160. The pixel electrode 170 may include at least one material selected from the group consisting of ITO, IZO, ZnO, $In_2O_3$, IGO, or AZO. When the pixel electrode 170 includes a reflective electrode, the pixel electrode 170 may include at least one metal selected from the group consisting of Al, Pt, Pd, Ag, Mg, Au, Ni, Nd, Ir, Cr, Li, Ca, Mo, Ti, W, or Cu.

The source and drain regions 145 and 141 that include an ion dopant are formed on the semiconductor layer 140. As an example, the semiconductor layer 140 may be doped with the ion dopant by only using the gate electrode 160 as a mask. As another example, in an operation before removing a photosensitive pattern after forming the gate electrode 160, the semiconductor layer 140 may be doped with the ion dopant by using the gate electrode 160 and the photosensitive pattern as a mask. The ion dopant may be boron or phosphorus ions, and the source and drain regions 145 and 141 may be formed by doping the semiconductor layer 140 with the ion dopant.

In the method of manufacturing the TFT substrate 1 according to an exemplary embodiment of the present invention described with reference to FIGS. 3 through 8, the storage capacitor Cst does not overlap the pixel electrode 170, and thus, the TFT substrate 1 may be applied to both a top emission type or a bottom emission type light-emitting apparatus. As example, in the TFT substrate 2 depicted in FIG. 2, the storage capacitor Cst overlaps the pixel electrode 170, and thus, the TFT substrate 2 may be applied to a top emission type light-emitting apparatus. Since an area of the storage capacitor Cst may be increased in the TFT substrate 2, the capacity of the capacitor may be increased.

Hereinafter, an organic light-emitting display apparatus 10 including a TFT substrate according to an exemplary embodiment of the present invention will be described.

Figure 9:
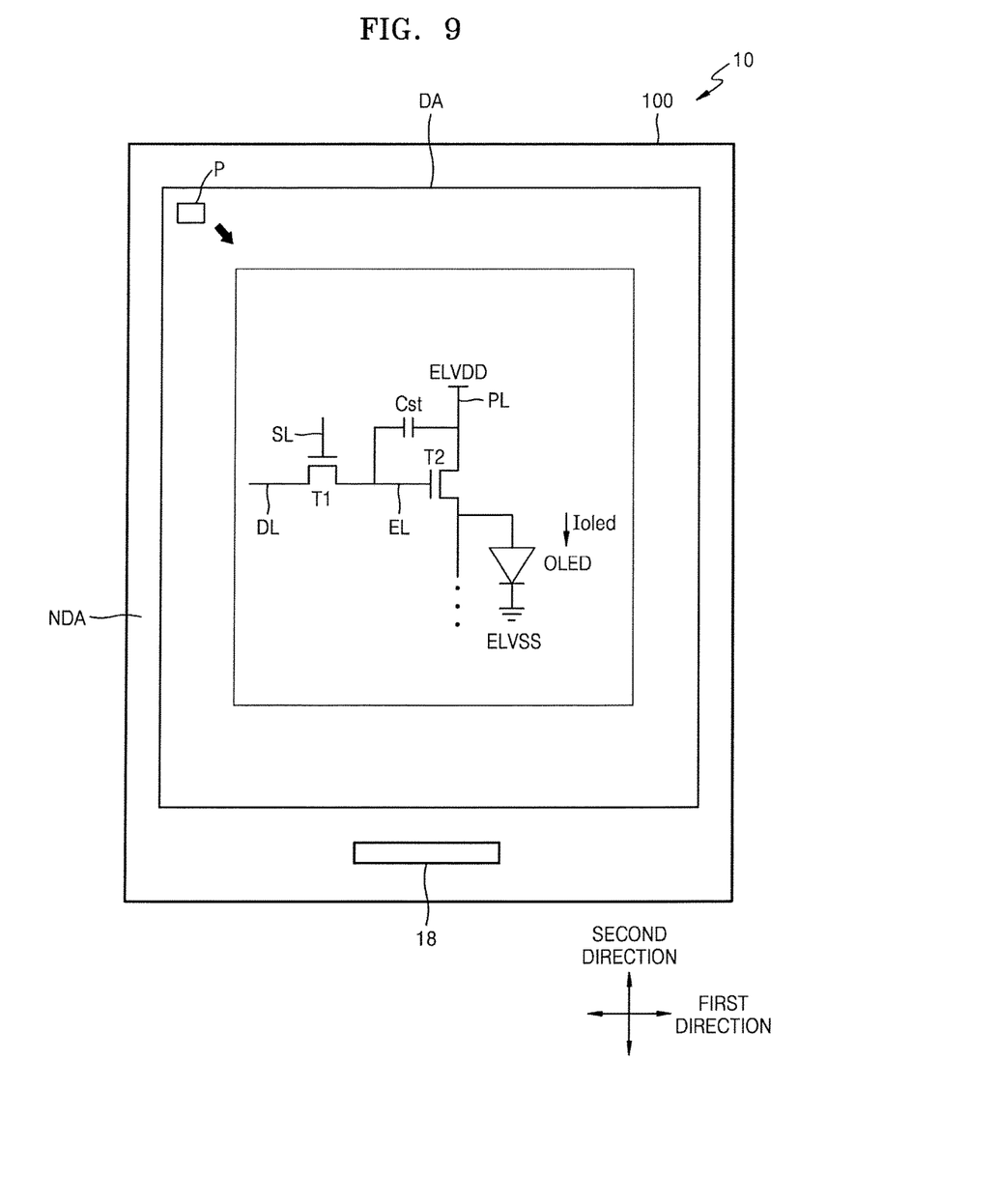
FIG. 9 is a plan view of an organic light-emitting display apparatus according to an exemplary embodiment of the present invention.
Figure 10:
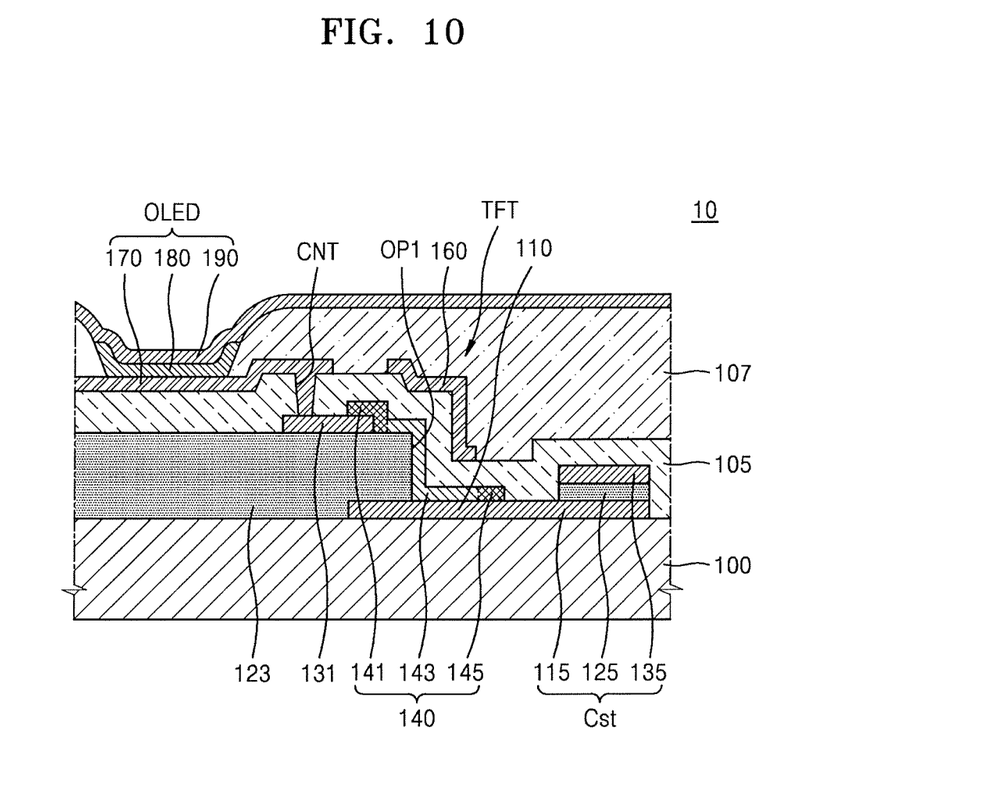
FIG. 10 is a cross-sectional view of a part of a pixel of the organic light-emitting display apparatus of FIG. 9 according to an exemplary embodiment of the present invention.

FIG. 9 is a plan view of the organic light-emitting display apparatus 10 according to an exemplary embodiment of the present invention. FIG. 10 is a cross-sectional view of a part of a pixel of the organic light-emitting display apparatus 10 of FIG. 9.

Referring to FIG. 9, the organic light-emitting display apparatus 10 according to the current exemplary embodiment of the present invention may include a display region DA and a non-display region NDA of a substrate 100. Further, the organic light-emitting display apparatus may include a first power source ELVDD and a second power source ELVSS.

The display region DA includes a plurality of pixel regions P to display an image. Each of the pixel regions P may include a plurality of TFTs T1 and T2 and a storage capacitor Cst. The pixel regions P may include a display device, for example, an organic light-emitting display diode OLED that emits light by receiving a driving voltage through the TFTs T1 and T2 and the storage capacitor Cst.

The non-display region NDA may be arranged adjacent to the display region DA. As an example, as depicted in FIG. 9, the non-display region NDA may surround the display region DA. As another example, the non-display region NDA may be arranged adjacent to a side of the display region DA. The non-display region NDA may include a pad unit 18.

As an example, the TFTs may include a single switching TFT T1 and a driving TFT T2. Although in FIG. 9, two TFTs are included, the current exemplary embodiment of the present invention is not limited thereto. As example, the type and the number of TFTs may vary.

A gate electrode of the switching TFT T1 may be connected to a scanning line SL. The source electrode may be connected to a data line DL and the drain electrode may be connected to an electrode of the storage capacitor Cst. The switching TFT T1 supplies a data signal supplied from the data line DL to a capacitor by being turned ON when a scanning signal is supplied from the scanning line SL. In addition, the storage capacitor Cst may charge a voltage corresponding to the data signal.

Referring to FIGS. 9 and 10, the driving TFT T2 may have the same structure as one of the TFTs of the TFT substrates 1 and 2 described above with reference to FIGS. 1 through 8. The TFT substrates 1 and 2 described above may be applied to either the switching TFT T1 or the driving TFT T2. However, in the current embodiment, for convenience of explanation, a case when the driving TFT T2 that substantially affects the driving of the OLED is the TFT having a structure described above will now be described in detail.

The gate electrode 160 of the driving TFT T2 may be connected to a gate control line EL that is electrically connected to the switching TFT T1. The lower electrode 110, which is a source electrode, may be electrically connected to a capacitor and a driving voltage line PL, and the upper electrode 131, which is a drain electrode, may be electrically connected to the pixel electrode 170 of the OLED. The upper electrode 131 of the driving TFT T2 may be electrically connected to the pixel electrode 170 with the second insulating layer 105 disposed therebetween.

The driving TFT T2 may be turned ON in response to the switching TFT T1 supplying a data signal, and may control a driving current Ioled that flows from the driving voltage line PL towards a facing electrode 190 in response to a voltage value stored in the storage capacitor Cst. An intermediate layer 180 of the OLED may emit light having a predetermined brightness by the driving current.

A third insulating layer 107 may be disposed on the pixel electrode 170 such that the pixel electrode is partially covered. In this case, the third insulating layer 107 may be a pixel-defining film. The third insulating layer 107 may be disposed on the second insulating layer 105 and may have an opening. The third insulating layer 107 may define a pixel region on the substrate 100.

Referring to FIG. 10, the OLED is arranged on the pixel electrode 170. The OLED may include the intermediate layer 180 and the facing electrode 190.

The intermediate layer 180 may include an organic light-emitting layer that emits red, green, and blue light, and the organic light-emitting layer may include a low molecular weight organic material or a polymer organic material. When the organic light-emitting layer includes a low molecular weight organic material layer, a hole transport layer (HTL) and a hole injection layer (HIL) may be stacked in a direction towards the pixel electrode 170, and an electron transport layer (ETL) and an electron injection layer (EIL) may be stacked in a direction towards the facing electrode 190 with the organic light-emitting layer as a center. Further, various layers may be stacked besides the HIL, the HTL, the EIL, and the ETL.

The facing electrode 190 is disposed on the pixel electrode 170 with the intermediate layer 180 disposed therebetween. When the facing electrode 190 is a (semi) transparent electrode, the facing electrode 190 may include a layer formed of lithium (Li), calcium (Ca), lithium fluoride (LiF)/Ca, LiF/Al, Al, Ag, Mg, and/or a compound of these metals, and a (semi) transparent conductive layer formed of ITO, IZO, ZnO, or $In_2O_3$. When the facing electrode 190 is a reflective electrode, the facing electrode 190 may include a layer formed of Li, Ca, LiF/Ca, LiF/Al, Al, Ag, Mg, and/or a compound of these metals. The configuration and the materials for the facing electrode 190 are not limited thereto. For example, the configuration and materials may be modified in various ways.

As described above, the organic light-emitting display apparatus 10 including the TFT substrate according to an exemplary embodiment of the present invention includes a vertical structure TFT, and thus, may increase an opening ratio. Also, in manufacturing the organic light-emitting display apparatus 10, the pixel electrode 170 and the gate electrode 160 are formed in the same mask process, and thus, manufacturing cost and process time may be reduced.

In addition, one or more exemplary embodiments of the present invention may include a TFT substrate configured to increase an opening ratio by reducing an area occupied by TFTs, and organic light-emitting display apparatuses having the TFT substrate, and methods of manufacturing the TFT substrate.

While the present invention has been particularly shown and described with reference to exemplary embodiments thereof, it will be apparent to those of ordinary skill in the art that various changes in form and detail may be made thereto without departing from the spirit and scope of the present invention as defined by the following claims.

What is claimed is:

1. A thin film transistor (TFT) substrate comprising:
a substrate;
a first electrode disposed on the substrate, wherein the first electrode is one of a source electrode and a drain electrode;
a first insulating layer disposed on the first electrode, wherein the first insulating layer exposes an upper surface of the first electrode;
a second electrode disposed on the first insulating layer, wherein the second electrode is the other one of the source electrode and the drain electrode, wherein the first insulating layer is disposed between the upper surface of the first electrode and a lower surface of the second electrode;
a semiconductor layer disposed on the first electrode, a side of the first insulating layer, and the second electrode;
a second insulating layer disposed on the semiconductor layer;
a gate electrode disposed on the second insulating layer and overlapping the semiconductor layer; and
a pixel electrode that comprises a same material as the gate electrode and is electrically connected to the second electrode.

2. The TFT substrate of claim 1, wherein the semiconductor layer overlaps the upper surface of the first electrode.

3. The TFT substrate of claim 1, wherein the first electrode comprises a non-overlapping region that does not overlap the second electrode.

4. The TFT substrate of claim 3, wherein the first insulating layer comprises a first opening that exposes the upper surface of the first electrode, and the first opening is located on the non-overlapping region of the first electrode.

5. The TFT substrate of claim 3, wherein the semiconductor layer contacts the non-overlapping region of the first electrode.

6. The TFT substrate of claim 1, wherein the semiconductor layer has a first width, and the gate electrode has a second width, wherein the first width is greater than the second width.

7. The TFT substrate of claim 1, further comprising a storage capacitor that comprises a first storage electrode, a dielectric layer, and a second storage electrode that are sequentially stacked, wherein the first storage electrode comprises a same material as the first electrode.

8. The TFT substrate of claim 7, wherein a part of the first electrode is the first storage electrode of the storage capacitor.

9. The TFT substrate of claim 7, wherein the dielectric layer comprises a same material as the first insulating layer.

10. The TFT substrate of claim 7, wherein the dielectric layer has a thickness that is less than that of the first insulating layer.

11. An organic light-emitting display apparatus comprising:
a TFT substrate of claim 1;
a third layer that is disposed on the pixel electrode of the TFT substrate and comprises an organic light-emitting layer; and
a third electrode disposed on the third layer.

12. A thin film transistor (TFT) substrate comprising:
a substrate;
a first electrode disposed on the substrate, wherein the first electrode is one of a source electrode and a drain electrode;
a first insulating layer disposed on the first electrode;
a second electrode disposed on the first insulating layer, wherein the second electrode is the other one of the source electrode and the drain electrode, wherein the first insulating layer is overlapped by the first electrode and the second electrode, and the first electrode, the first insulating layer and the second electrode are arranged sequentially in a direction perpendicular to a top surface of the substrate;
a semiconductor layer disposed on the first electrode, the first insulating layer, and the second electrode, wherein the semiconductor layer contacts the second electrode on an upper surface of the first insulating layer and contacts the first electrode below the upper surface of the first insulating layer;
a second insulating layer disposed on the semiconductor layer;
a gate electrode disposed on the second insulating layer and overlapping the semiconductor layer; and
a pixel electrode that comprises a same material as the gate electrode and is electrically connected to the second electrode.

13. The TFT substrate of claim 12, wherein the semiconductor layer overlaps an upper surface of the first electrode.

14. The TFT substrate of claim 12, wherein the first electrode comprises a non-overlapping region that does not overlap the second electrode.

15. The TFT substrate of claim 14, wherein the first insulating layer comprises a first opening that exposes an upper surface of the first electrode, and the first opening is located on the non-overlapping region of the first electrode.

16. The TFT substrate of claim 14, wherein the semiconductor layer contacts the non-overlapping region of the first electrode.

17. The TFT substrate of claim 12, wherein the semiconductor layer has a first width, and the gate electrode has a second width, wherein the first width is greater than the second width.

18. The TFT substrate of claim 12, further comprising a storage capacitor that comprises a first storage electrode, a dielectric layer, and a second storage electrode that are sequentially stacked, wherein the first storage electrode comprises a same material as the first electrode.

19. The TFT substrate of claim 18, wherein a part of the first electrode is the first storage electrode of the storage capacitor.

20. The TFT substrate of claim 18, wherein the dielectric layer comprises a same material as the first insulating layer.

* * * * *